US006950129B1

(12) United States Patent
Minne et al.

(10) Patent No.: US 6,950,129 B1
(45) Date of Patent: Sep. 27, 2005

(54) ONE-TIME-USE DIGITAL CAMERA

(75) Inventors: Mark W. Minne, Boise, ID (US); Todd A. Miklos, Fort Collins, CO (US); James S. Voss, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 889 days.

(21) Appl. No.: 09/718,322

(22) Filed: Nov. 22, 2000

(51) Int. Cl.$^7$ .............................................. H04N 5/76
(52) U.S. Cl. .......................... 348/231.7; 348/231.99; 348/231.8
(58) Field of Search .................. 348/231.99, 231.4, 348/231.7, 231.8, 552, 376; 396/320, 321; 711/115, 200; 365/175

(56) References Cited

U.S. PATENT DOCUMENTS

| | | | |
|---|---|---|---|
| 4,489,351 A | * | 12/1984 | d'Alayer de Costemore d'Arc 348/231.7 |
| 4,714,962 A | | 12/1987 | Levine |
| 5,055,930 A | * | 10/1991 | Nagasaki et al. ............ 348/317 |
| 5,343,267 A | | 8/1994 | Kazumi |
| 5,376,965 A | | 12/1994 | Nagasaki et al. |
| 5,404,463 A | | 4/1995 | McGarvey |
| 5,606,365 A | | 2/1997 | Maurinus et al. |
| 5,625,429 A | | 4/1997 | Kazami et al. |
| 5,633,678 A | | 5/1997 | Parulski et al. |
| 5,668,596 A | | 9/1997 | Vogel |
| 5,697,001 A | | 12/1997 | Ring et al. |
| 5,715,486 A | | 2/1998 | Kim et al. |
| 5,737,491 A | | 4/1998 | Allen et al. |
| 5,790,193 A | | 8/1998 | Ohmori |
| 5,897,228 A | * | 4/1999 | Schrock ...................... 396/310 |
| 5,898,779 A | | 4/1999 | Squilla et al. |
| 5,917,542 A | | 6/1999 | Moghadam et al. |
| 6,005,613 A | | 12/1999 | Endsley et al. |
| 6,055,180 A | | 4/2000 | Gudesen et al. |
| 6,078,756 A | | 6/2000 | Squilla et al. |
| 6,137,535 A | | 10/2000 | Meyers |
| 6,431,768 B1 | * | 8/2002 | Nakamura ................. 396/348 |
| 6,545,891 B1 | * | 4/2003 | Tringali et al. ............... 365/51 |
| 6,553,468 B1 | * | 4/2003 | Smith ......................... 711/159 |
| 6,628,325 B1 | * | 9/2003 | Steinberg et al. ......... 348/211.1 |
| 6,738,096 B1 | * | 5/2004 | Silverbrook ............... 348/376 |
| 2001/0040625 A1 | * | 11/2001 | Okada et al. ............... 348/552 |
| 2002/0065741 A1 | * | 5/2002 | Baum ......................... 705/26 |
| 2003/0058355 A1 | * | 3/2003 | Wong et al. ............ 348/231.99 |
| 2003/0112356 A1 | * | 6/2003 | No et al. ................ 348/333.01 |

FOREIGN PATENT DOCUMENTS

| | | | | |
|---|---|---|---|---|
| JP | 09154052 A | * | 6/1997 | ......... H04N 5/225 |
| JP | 11234542 A | * | 8/1999 | ......... H04N 5/225 |
| JP | 2000196931 A | * | 7/2000 | ......... H04N 5/225 |
| JP | 2000196995 A | * | 7/2000 | ......... H04N 5/907 |
| JP | 2000228740 A | * | 8/2000 | ......... H04N 5/225 |
| WO | WO 99/08325 | | 2/1999 | |
| WO | WO 00/38234 | | 6/2000 | |

\* cited by examiner

Primary Examiner—Aung Moe

(57) ABSTRACT

In one embodiment, the present invention provides a one-time-use camera. The one-time-use camera includes an electronic digital camera system for generating digital image data representative of a captured image. A non-volatile memory is provided in communication with the electronic digital camera system for storing the digital image data. The non-volatile memory component includes a memory matrix component, the matrix memory component including a first layer of parallel conductors, a second layer of parallel conductors oriented mutually orthogonal to the first set of parallel conductors, and a functional medium disposed between the first layer and the second layer. An addressable cell in the functional medium is defined at an intersection of each first layer parallel conductor and second layer parallel conductor. Supplying electrical energy directly to the functional medium of the cell detects or changes the logical state of the cell, for reading and writing the digital image data at the matrix memory component.

46 Claims, 7 Drawing Sheets

ONE-TIME-USE DIGITAL CAMERA

THE FIELD OF THE INVENTION

The present invention generally relates to one-time-use or "disposable" cameras, and more particularly, to a system and method for a one-time-use or disposable digital camera.

BACKGROUND OF THE INVENTION

Disposable cameras provide a relatively inexpensive method for a user to capture memories on a photosensitive film without purchasing an expensive camera or if they have forgotten their camera while away from home (e.g., while on vacation). Disposable cameras are often sold in convenient places close to places where a user may have a need for such a camera, such as in convenience stores, shopping malls, or vacation places. A typical disposable camera includes a plastic housing, lens and shutter system, a film advance system, and photosensitive film preloaded within the housing. Images are captured on the film. The film is advanced manually. After the maximum number of pictures have been taken, the entire camera is brought to a developer. The developer removes the film from the camera for processing. The camera is either disposed of by the developer, or portions of the camera may be recycled by the manufacturer for reuse in a new one-time-use camera and resold to a consumer.

More advanced disposable cameras include a flash system and battery which automatically recharges for the next subsequent picture. Other electronics may be included within the disposable camera, such as an LED indicator for notifying a user that the flash has recharged to a level suitable for use.

Disposable cameras have many limitations. Disposable cameras typically do not employ focusable lens systems or autofocus lens systems, limiting picture quality. Further, since typical disposable cameras are manual, many other automatic features are not included with the camera such as automatic film advance and camera display features. Known disposable cameras are also limited to capturing an image on a photosensitive medium (i.e., film) and are not capable of storing video (i.e., motion) or sound. Images captured on film using the disposable camera are not directly available in a digital format.

Digital cameras utilize image sensor technology and memory storage for capturing and storing images in a digital format. The digital format allows images to be available instantly with no need for a chemical development process necessary for a conventional camera using light-sensitive films. The image is captured utilizing a charge coupled device (CCD) or CMOS (complimentary metal-oxide semiconductor) sensors. Camera electronics are utilized for converting the image into a digital format. The number of pictures a user may take is limited by the size and type of memory included in the digital camera. Once the camera memory is full, it can be downloaded to a personal computer or other device and the pictures are deleted from the camera.

Modern digital cameras use removable memory storage, typically in the form of a memory card. Once a memory card is full it can be removed from the camera and replaced by a another memory card. Also, with additional hardware, memory cards can be inserted directly into a personal computer and photos read to the personal computer similar to accessing a hard disk drive. One known removable memory storage is CompactFlash available from SanDisk Corporation. CompactFlash cards weigh very little (approximately 11.4 grams) and are 43×36×3.3 mm. CompactFlash cards are based on flash memory technology and provide non-volatile storage of digital images. Known Compact-Flash cards have memory capacities in the range of 4 megabytes to 48 megabytes. Another known removable memory storage is a Smart Media card (also known as SSFDC—solid state floppy disk card) available from Toshiba Corporation. Smart Media cards are smaller and lighter than compact flash cards, weighing 0.48 grams with a form factor of 45×37 mm and a thickness of only 0.78 mm. Smart Media cards have a memory storage capacity less than CompactFlash cards, with a known maximum capacity in the range of 16 megabytes. Known higher-end or professional digital cameras may use very small hard disk drives, known as microdrives, as their storage medium. One known microdrive is available from IBM Corporation. The IBM microdrive uses a single one-inch diameter platter that weighs just 16 grams and spins at 4,500 rpms. The microdrives have much higher capacity than flash memory but consume substantially more space and power. At this time, the use of disk drives as a storage medium for everyday use digital cameras are even more impractical due to fragility and reliability reasons, because of the moving parts and extremely tight mechanical tolerances to which the hard drives are built.

The need exists for a relatively inexpensive disposable camera which includes the benefits of digital cameras such as storing a captured image in a digital format, including the ability to store both still and video images, with sound, in a digital format.

SUMMARY OF THE INVENTION

The present invention provides a digital camera. In one aspect, the digital camera is a one-time-use or disposable digital camera for storing an image in a digital format readily available for use. The present invention also provides a method of using a one-time-use or disposable digital camera which allows a customer to receive their images in a digital format on a portable storage medium, such as a digital video disk.

In one embodiment, the present invention provides a one-time-use camera. The one-time-use camera includes an electronic digital camera system for generating digital image data representative of a captured image. A non-volatile memory is provided in communication with the electronic digital camera system for storing the digital image data. The non-volatile memory includes a memory matrix component, the matrix memory component including a first layer of parallel conductors, a second layer of parallel conductors oriented mutually orthogonal to the first set of parallel conductors, and a functional medium made of a polymer material disposed between the first layer and the second layer. An addressable cell in the functional medium is defined at an intersection of each first layer parallel conductor and second layer parallel conductor. Supplying electrical energy directly to the functional medium of the cell detects or changes the logical state of the cell, for reading and writing the digital image data at the matrix memory component.

In another embodiment, the present invention provides a method of using a one-time-use camera. The method includes defining a digital camera including a camera housing having a first portion and a second portion, an electronic digital camera system for generating digital image data representative of a captured image, and a non-volatile memory attached to the second portion of the housing and in communication with the electronic digital camera system for storing the digital image data. An image is captured using the digital camera and stored as digital image data in the non-volatile memory. The non-volatile memory is removed. The digital image data is transferred from the non-volatile memory to a portable medium.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
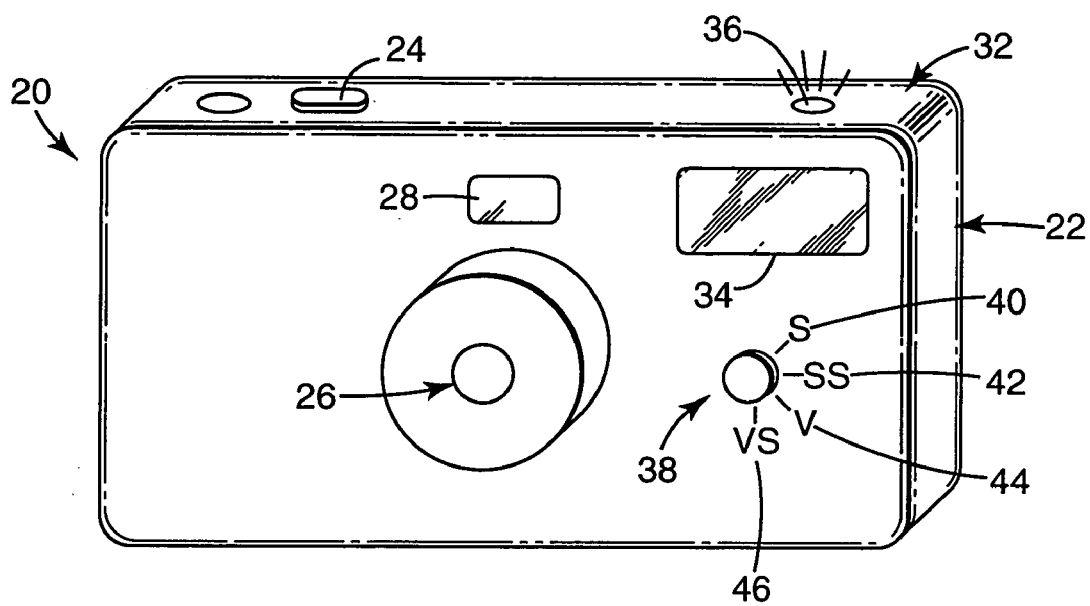
FIG. 1 is a perspective view illustrating one exemplary embodiment of a digital camera according to the present invention.

FIG. 1 is a perspective view illustrating one exemplary embodiment of a digital camera in accordance with the present invention at 20. Digital camera 20 is suitable for use as a one-time-use or disposable camera by employing a unique, relatively inexpensive electronic digital camera system for generating digital image data representative of a captured image, in combination with a non-volatile memory for storing the digital image data. In one preferred embodiment, the non-volatile memory is secured to a removable portion of the camera housing. In one preferred embodiment, the non-volatile memory is a relatively inexpensive memory which includes a matrix memory component including a first layer of parallel conductors oriented mutual orthogonal to a second layer of parallel conductors, separated by a functional medium including a polymer material. Supplying electrical energy directly to the functional medium of the cell detects or changes the logical state of the cell, for reading and writing the digital image data representative of captured images at the matrix memory component. The one-time-use digital camera 20 is relatively inexpensive, while employing many features associated with high-end digital cameras used by professional photographers. The digital camera 20 can capture both high-quality (i.e., high resolution) still images and high frame rate, motion images. Additionally, the digital camera 10 can record sound associated with those captured images.

Digital camera 20 is substantially contained within housing 22. In one aspect, housing 22 is made of a rigid polymeric material (i.e., plastic). Housing 22 includes multiple openings for operational and user features of digital camera 20. In one aspect, housing 22 includes push button 24, lens system 26, view finder 28, display 30, and flash system 32. Inage capture button 24 is operated by a user to capture an image with digital camera 20. The captured image may be a still image or video (i.e., motion). Lens system opening 26 provides for operation of a lens system and shutter assembly to allow a photographed image to be captured by the digital camera 20. Display 30 is utilized to display operational features of digital camera 20, such as the number of pictures taken, battery status, etc. Display 30 may comprise an electronic or liquid crystal display, and may display other features as known in digital cameras. Flash system 32 includes flash 34 and flash ready indicator 36. In one aspect, flash 34 is a rechargeable flash. In one aspect, flash ready indicator 36 provides a blinking indication that flash 34 is fully recharged and ready for use.

In one embodiment, digital camera 20 includes mode selector 38, allowing digital camera 20 to be switched between different modes of operation. In one aspect, mode selector 38 operates to switch or change the operational mode of digital camera 20 between a still image mode 40 (indicated as S), a still image with sound mode 42 (indicated as SS), a video (motion) mode 44 (indicated as V) and a video with sound mode 46 (indicated as VS).

Figure 2:
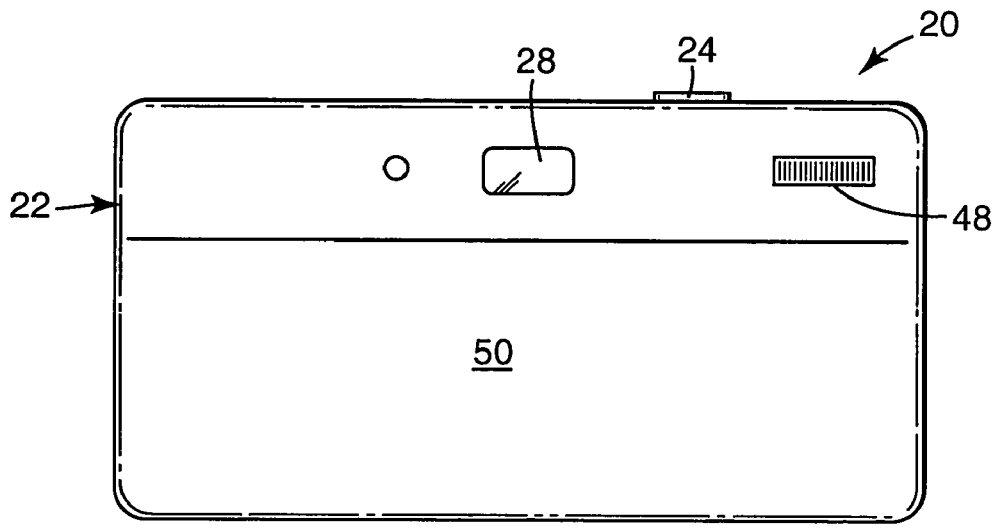
FIG. 2 is a rear view of the digital camera illustrated in FIG. 1.

FIG. 2 illustrates one exemplary embodiment of a rear view of the digital camera shown in FIG. 1. Digital camera 20 may automatically advance to the next digital image storage location, or may include advance mechanism 48 for manually advancing between stored digital images or other display features. The housing 22 of digital camera 20 also includes removable portion 50. In one embodiment, the removable portion 50 is located on the back or rear side of digital camera 20. Removable portion 50 is utilized to access a non-volatile memory located with in digital camera 20 where the digital images are stored.

Figure 3:
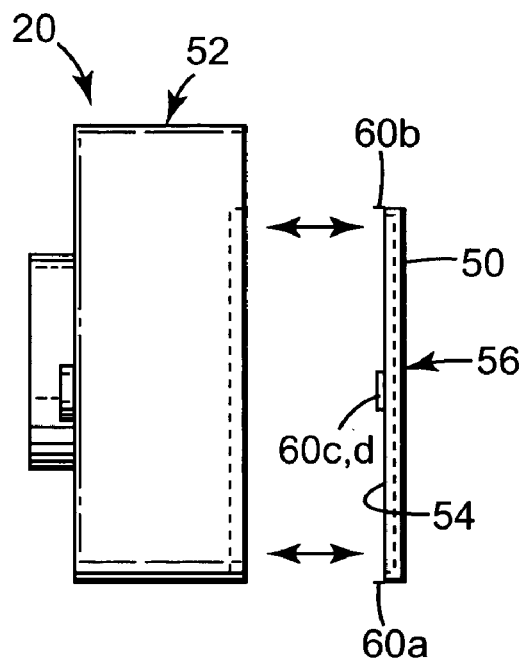
FIG. 3 is a side view illustrating one exemplary embodiment of the digital camera of FIG. 1, wherein a portion of the digital camera including a memory is removable from the digital camera.

FIG. 3 is a side elevational view illustrating one exemplary embodiment of the digital camera of FIG. 1. FIG. 3 illustrates removable portion 50 being removed from a front portion 52 to access a non-volatile memory 54 of digital camera 20. In one embodiment, the non-volatile memory 54 is attached to the back or removable portion 50 to define a removable camera back memory assembly 56. The camera back memory assembly 56 includes tab mechanisms 58 which allow the camera back memory assembly 56 to be securely and operationally attached to digital camera 20, while also allowing removal of the camera back memory assembly 56 from the digital camera 20. Once the memory component 54 in camera back memory assembly 56 has been used (or is full), the camera back memory assembly 56 is removed from the digital camera 20. In one aspect, a second camera back memory assembly 56 is secured to the digital camera 20 using similarly aligned tab mechanisms, allowing digital camera 20 to be reused.

Figure 4:
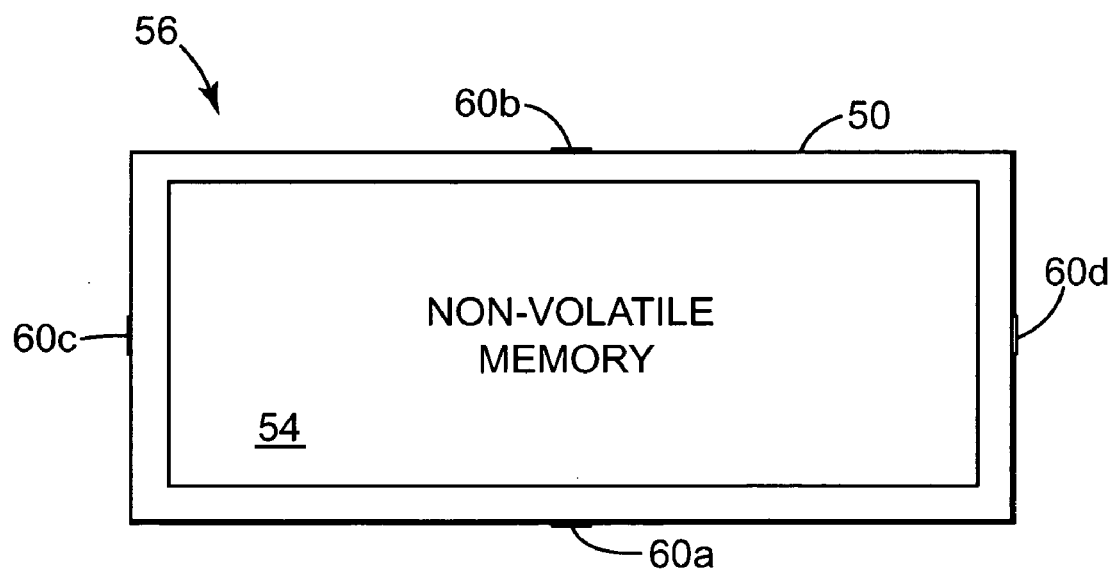
FIG. 4 is a diagram illustrating one exemplary embodiment of the removable portion of a digital camera according to the present invention.

FIG. 4 illustrates one exemplary embodiment of camera back memory assembly 56. The non-volatile memory 54 is positioned within removable portion 50, and preferably secured to a major surface of the removable portion 50. In one aspect, the memory 54 has sufficient memory capacity to hold both still and motion images. For example, memory 54 can be 100 to 200 megabytes to hold approximately 100 still images or a combination of 25–50 still images and 15 minutes worth of video or motion with sound. The capture images can be very high resolution images. Greater memory capacities can be achieved with a larger size or volume memory 54. The non-volatile memory 54 is installed "at the factory" in the portion 56. After use, the camera back memory assembly 56 is removable from the digital camera 20 at a processing location, where the digital images can be immediately downloaded to a user friendly medium, such as a digital video disk, videotape, network storage location, and/or prints of the images. As such, the user is not required to have the use of a computer. The camera back memory assembly can be replaced with a second camera back memory assembly on the digital camera 20 for use, being available to be sold again to another user. As such, the one-time-use camera may be reused or recycled. A user obtains their memories or captured images in a digital form, providing them with great flexibility and the use of those images. Further, the one-time-use digital camera 20 according to the present invention provides for an inexpensive method to capture video or motion based memories (e.g., a child's first steps, a child's first words or memories from a vacation). Further, since these memories are in a digital format, they may be readily shared electronically or on prints with friends and family members.

Figure 5:
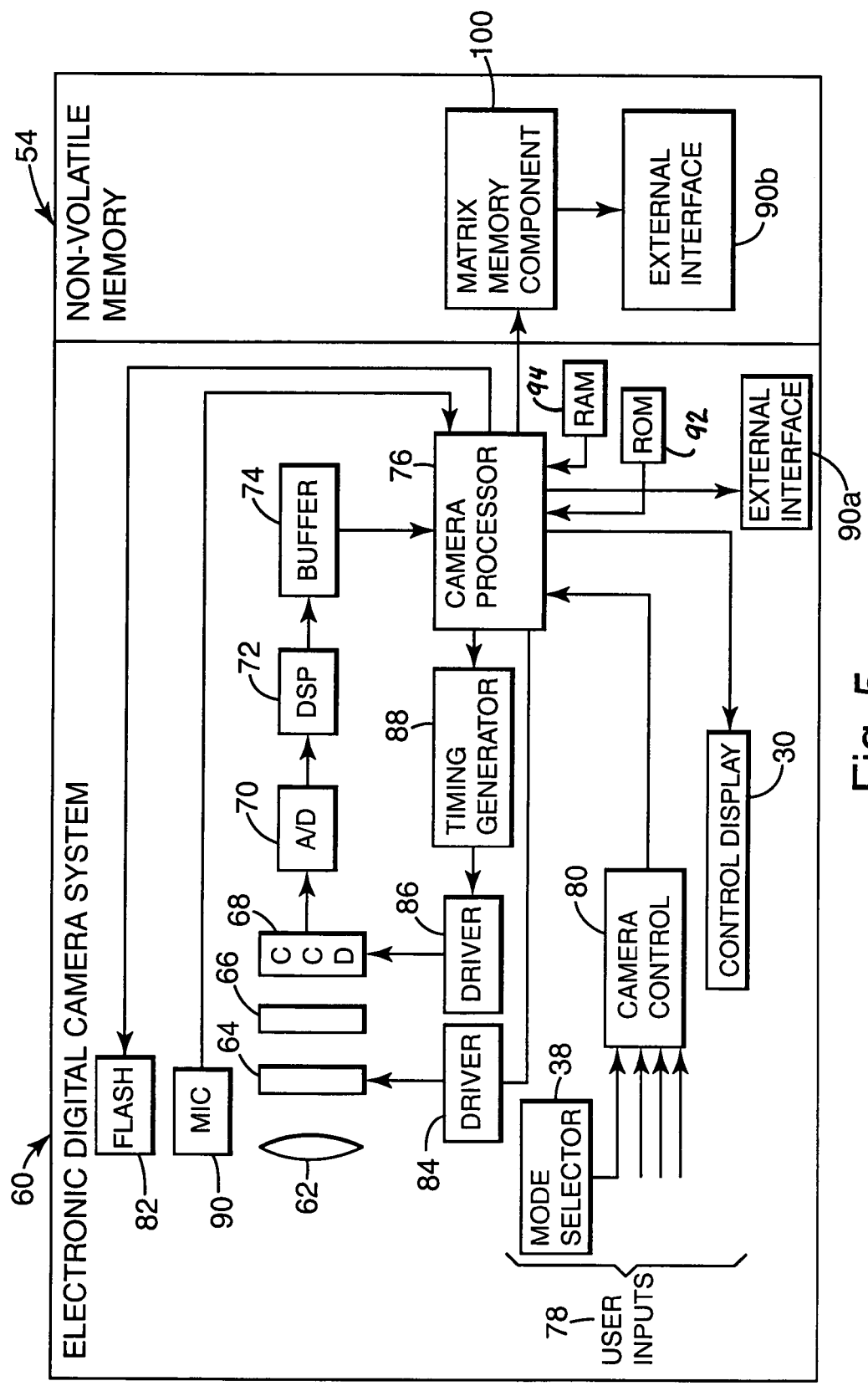
FIG. 5 is a block diagram illustrating one exemplary embodiment of a digital camera according to the present invention.

FIG. 5 is a block diagram illustrating one exemplary embodiment of digital camera 20, suitable for use as a one-time-use digital camera. Digital camera 20 includes electronic digital camera system 60 and non-volatile memory 54. Electronic digital camera system 60 generally includes lens system 62, shutter system 64, filter system 66, solid state image capture array 68, analog to digital (A/D) converter 70, digital signal processor (DSP) 72, buffer 74, and camera processor 76. Camera processor 76 controls and processes operational signals for electronic digital camera system 60. For example, camera processor 76 receives user input 78 via camera control 80, which includes inputs from mode selector 38 or other manual user inputs, such as depression of the image capture button 24 by a user. The camera processor 76 also controls other exposure parameters and illumination parameters (e.g., operation and timing of flash 82).

Image capture array 68 is positioned behind lens system 62 for capture of a still or motion photographed image. In one aspect, image capture array 68 comprises a charge coupled device (CCD). Optionally, a filter system 66 may be positioned between the lens system 62 and image capture array 68. Shutter system 64 (e.g., a shutter and aperture mechanism) is responsive to an exposure control signal received from camera processor 76 via driver 84 for exposing the image capture array 68 to the image focused thereon by lens system 62 in a conventional manner. The image capture array 68 is responsive to a driver 86 in order to develop raw, analog image information which is amplified and supplied to A/D converter 70. The array driver 86, operated by a timing generator 88 in response to the camera processor 76, clocks out the analog image information to the A/D converter 70 after exposure of the image array 68 is complete. The A/D converter 70 digitizes the raw, analog image information as a digital information set and supplies it to buffer memory 74. The information set is then retrieved by camera processor 76 and optionally subjected to compression before being stored in non-volatile memory component 54.

Optionally, microphone (MIC) 90 is utilized for receiving a sound signal associated with a captured image. Read only memory (ROM) 92 and random access memory (RAM) 94 are utilized for corresponding persistent and temporary storage of camera processor control programs and signal processing data. Additionally, camera processor 76 provides an output to control display 30 to display output parameters and features (e.g., number of images captured, amount of memory available, battery status, etc.).

Electronic digital camera system 60 may also include external interface 90 (indicated as 90A). External interface 90A provides an external interface to external devices for transfer of images captured by digital camera 20 to the external device or medium. For example, external interface 90 may comprise a USB port (universal serial bus interface port, as known to one skilled in the art).

Non-volatile memory 54 includes matrix memory component 100 and external interface 90B. Non-volatile memory 54 may include other electronics for communicating with electronic digital camera system 60. Matrix memory component 100 provides for persistent storage of images captured via electronic digital camera system 60. The captured images are stored in a digital format in matrix memory component 100. Optionally, external interface 90 (indicated as 90B) is located at non-volatile memory component 54. As such, digital images stored in matrix memory component 100 can be transferred to an external device via external interface 90B. The external devices (not shown) may provide for transfer of the digital images to a user readable medium, such as a digital video disk or hard disk drive.

Figure 6:
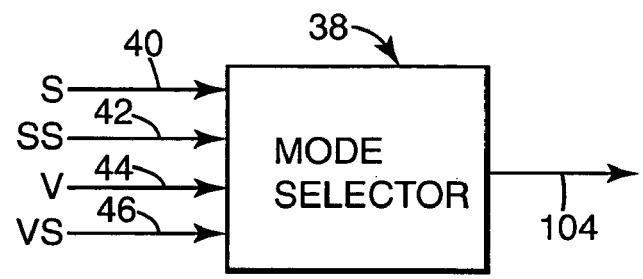
FIG. 6 is a block diagram illustrating one exemplary embodiment of a mode selector used with a digital camera according to the present invention.

FIG. 6 illustrates one exemplary embodiment of mode selector 38. In particular, mode selector 38 provides an output signal (such as the completion of a control circuit) to camera processor 76 via camera control 80 which is representative of the desired user mode. In one aspect shown, digital camera 20 includes still image mode 40, still image mode with sound 42, video or motion mode 44, and video with sound mode 46. A desired mode can be manually selected by a user. Through operation of the electronic digital camera system 60, including control via camera processor 76, the digital camera 20 can produce both high-quality (e.g., high resolution) still images via still image mode 40 and high frame rate motion images via video or motion mode 44. Optionally, sound associated with the captured images may be recorded via the selection of still image mode 42 or video or motion with sound mode 46.

Matrix memory component 100 provides a relatively inexpensive, reliable, high-capacity storage medium suitable for use with a one-time-use digital camera. In one embodiment, matrix memory component 100 is a write once memory. In one preferred embodiment, the matrix memory component 100 includes a first layer of parallel conductors and a second layer of parallel conductors oriented mutually orthogonal to the first set of parallel conductors. A functional medium is disposed between the first layer of parallel conductors and the second layer of parallel conductors. An addressable cell in the functional medium is defined at an intersection of each first layer of parallel conductors. Supplying an electrical energy directly to the functional medium of the cell detects or changes the logical state of the cell, for reading and writing digital image data representative of the captured images at the matrix memory component 100. In one embodiment, the functional medium is made of an organic material. In one aspect, the functional medium includes a polymer material. In one aspect, the functional medium includes an amorphous silicon material. In one aspect, the functional medium includes a low molecular weight organic material. In one aspect, matrix memory component 100 has a capacity of 100 to 200 megabytes for storing a combination of still images or motion images. In one aspect, component 100 is capable of storing 100 still images or 25–50 still images and 15 minutes of video or motion images. In another aspect, matrix memory component 100 is greater than 200 megabytes.

Figure 7:
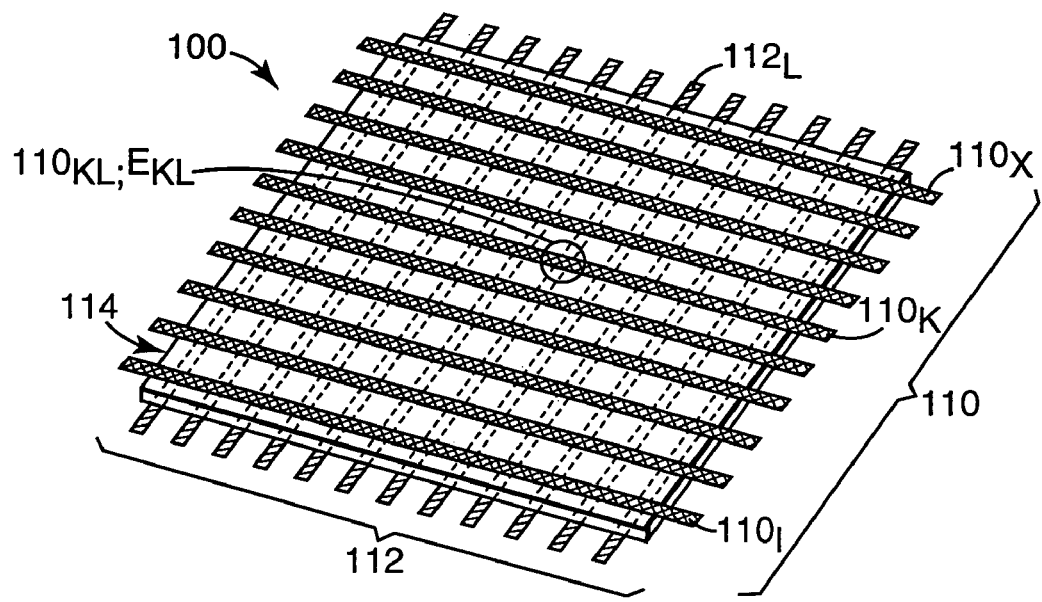
FIG. 7 is a perspective diagram illustrating one exemplary embodiment of a matrix memory component used in a digital camera according to the present invention.
Figure 9:
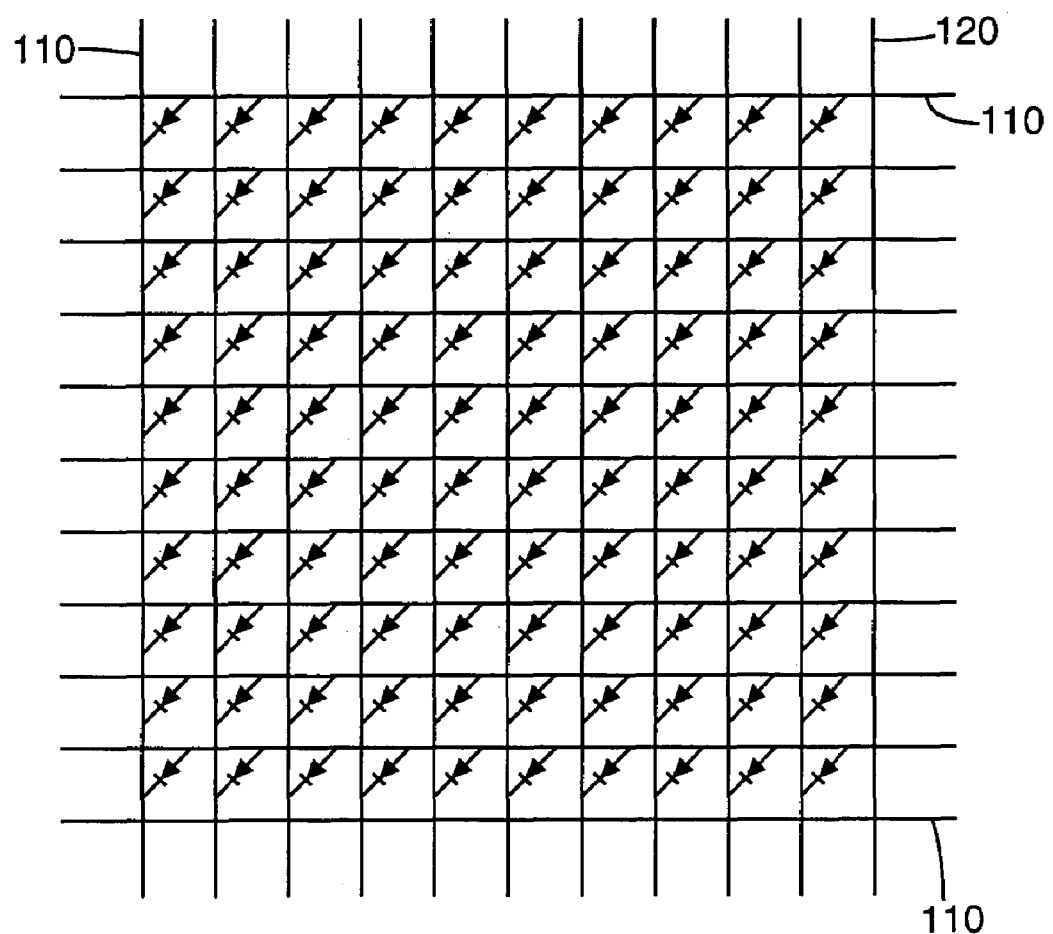
FIG. 9 is a diagram illustrating one exemplary embodiment of an electrical representation of the matrix memory component of FIG. 7.

FIG. 7 illustrates one exemplary embodiment of a matrix memory component suitable for use with one-time-use digital camera 20. The electrically addressable passive device according to the invention is realized as a matrix addressable component or device. Matrix memory component 100 includes a first layer of parallel conductors 110, a second layer of parallel conductors 112, and a functional medium 114 disposed (i.e., positioned) between conductor layer 110 and conductor layer 114. The functional medium or layer 114 is provided in the form of a planar layer. The functional medium 114 is an organic material with non-linear impedance characteristic, and may include different substances added in order to realize desired detecting or switching functions. On an upper surface of layer 114 there are provided lines for electrical addressing in the form of a plurality of electric conductors 110, and on the lower surface of the layer 114 there are correspondingly provided lines for electrical addressing in the form of parallel electric conductors 112, the conductors 110, 112 being provided mutually orthogonal such that they form a matrix. In FIG. 7 the device is shown with x conductors 110 and y conductors 112 such that the conductors form a planar orthogonal x, y matrix. A logic cell 120 in the device is generated in the functional medium 114 volume between two intersecting electric conductors 110, 112. This is emphasized by the formation of an element $120_{kl}$ in the intersection point between the k'th conductor 110 and the l'th conductor 112.—If all elements 120 are formed with a rectifying function, the component or device may be represented by an electric network of rectifying diodes, such as shown by the equivalent diagram in FIG. 9.

The opposing portions of the conductor $110_k$ and $112_l$ in an intersection point comprises together the electrode means $E_{kl}$ of the logic cell $120_{kl}$, as the anode 122 in the electrode means may be the conductor $110_k$ and the cathode 124 in the electrode means the conductor $112_l$. For several of the purposes of the present invention the cell $120_{kl}$ is denoted as a logic element or logic cell, as the material or the functional medium in the cell by the addressing may assume different physical or chemical states which represent electrically detectable logical values.

Figure 8:
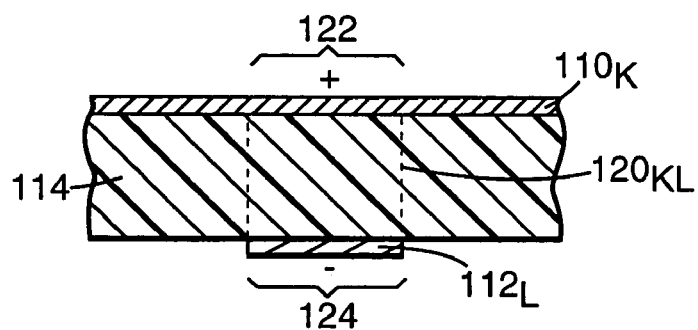
FIG. 8 is an enlarged partial cross-sectional view illustrating one exemplary embodiment of an intersecting region defining a cell in the matrix memory component of FIG. 7.

In section this is shown schematically in FIG. 8, wherein the functional medium 114 is provided in the form of a layer between the conductors $100_k$, $112_l$, the anode 122 and the cathode 124 of the electrode means $E_{kl}$, being comprised by respectively the relevant portion of the conductor $110_k$ and the relevant portion of the conductor $112_l$, in the intersection point between the conductors. In this intersection point, i.e., between the anodes 122 and the cathode 124, a passive logic cell is formed, in FIG. 8 denoted as $120_{kl}$ in order to indicate that it is located between the conductor $110_k$ and the conductor $112_l$. FIG. 8 is, of course, only a section of FIG. 7 and it is to be understood that the whole section taken along the conductor 110, 112 will show a total of y logic cells 120 and y conductors $112_y$. If x≠y, the device is rectangular, and if x=y, the device is square with $x^2$ cells.

Figure 10:
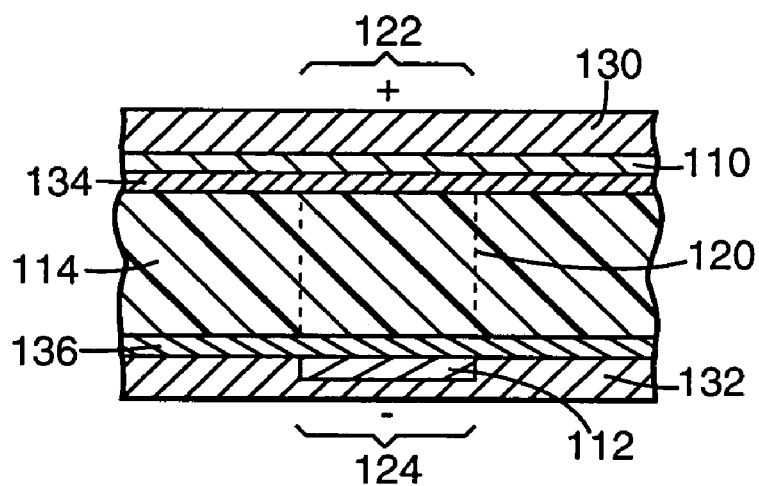
FIG. 10 is an enlarged partial cross-sectional view illustrating another exemplary embodiment of a cell in a matrix memory component used in a digital camera according to the present invention.

A more complex embodiment of the device according to the invention, exemplified as a section through a cell 120 is shown in FIG. 10. Here the electric conductor 110 is provided on a substrate 130, while the electric conductor 112 correspondingly is provided on a substrate 132. As shown in FIG. 8 the conductors 110, 112 might contact the functional medium 114 directly, but in the embodiment in FIG. 10 it is further shown provided dielectric layers 134, 136 between, respectively, the conductors 110, 112 or the substrates 130, 132. Hence the electrode means E by its anode 122 and its cathode 124 no longer contacts the functional medium 114 directly, but indirectly via the dielectric layer 134, 136, such that an indirect electric coupling is formed through the cell 120. This coupling could for instance be inductive or capacitive. If the dielectric layers 134, 136 are absent, the electrode means E will, of course, contact the functional medium 114 directly and a corresponding direct or ohmic coupling is obtained through the cell 120.

Briefly stated the volume between the anode 122 and the cathode 124 of the electrode means E, the scale of which roughly is defined by the widths of the conductors 110, 112 and the distance therebetween, i.e. the thickness of the functional medium 114, defines a logic cell 120 which for instance forms a detector element in an optical detector or a memory element in a data storage device or a switching element in a data processing device.

The anode 122 and the cathode 124 which surrounds the functional medium 114 are included in the electrode means E which, when an electric voltage is applied thereto, will cause a physical or chemical change of state in the functional medium 114. This will cause a change in the electric impedance between the anode 122 and the cathode 124 and this impedance change can be detected on the electric conductors 110, 112 which form the electrode means E in question. The logical state or the logical value in each intersection point between 110 and 112 or in each cell 120 may then be determined by measuring the electric impedance between the electric conductors 110, 112 which form the electrode means E of the cell 120.

The matrix memory component used in the digital camera according to the present invention employs a functional medium 114 with non-linear impedance characteristic and formed by one or more organic materials and this has far-reaching implications in regard of constructional flexibility, operational features and costs. An important feature of using a functional medium of this kind is the possibility of an extensive use of purely passive addressing even in very large matrices, e.g. from $10^6$ to $10^8$ elements provident with a density of for instance $10^8$ elements per $cm^2$, as there will not be required any discrete active circuit elements in the intersection points.

Figure 11:
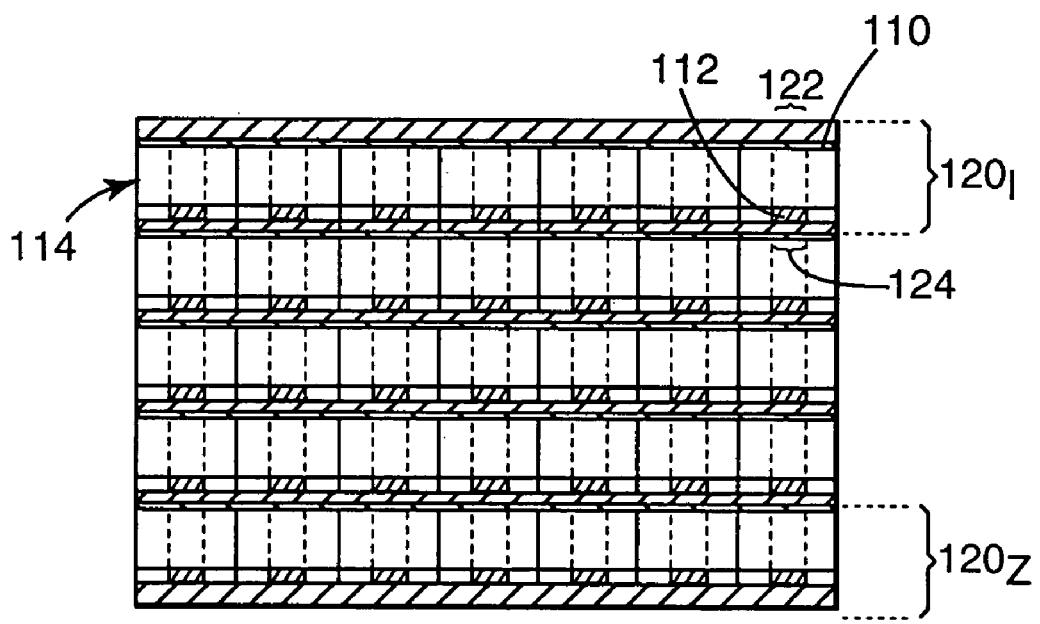
FIG. 11 is a partial cross-sectional view illustrating another exemplary embodiment of a matrix memory component used in a volumetric configuration for a digital camera according to the present invention.

The device used with the digital camera 20 according to the invention forms a substantially plane layer-like structure, and as such it is possible to stack such plane layer-like structures layerwise and form a volumetric logic device, for instance a volumetric memory device. This may be realized as in FIG. 11, wherein there is shown a volumetric device of this kind consisting of stacked layers of structures, indicated as $100_a$, $100_b$, $100_c$ ... $100_n$ shown in section through a row of the cells 120 of the device, one of which is indicated in the Figure. The embodiment of the logic device according to the invention and the method used for electrical addressing in a matrix-based format at the same time realize proximity addressing, i.e. the signals for addressing are conveyed in immediate connection to the functional medium 114 and the influences this over the electrode means E which in FIG. 11 is shown for a logic cell 120 with respectively the anode 122 and the cathode 124 in the structure $100_a$. If several structures $100_a$, ... $100_n$ are stacked upon each other, they must be mutually isolated, preferably by an isolating layer 130 which may be electrically, thermally or optically isolating.

In principle each cell 120 of the device may have a very small extension, for instance of the magnitude of some ten nanometers and even less if the functional medium 114 for instance is based on layers of e.g. polymer materials, amorphous silicon material, etc. The thickness of the structure of 100 becomes correspondingly small and hence it will be seen that the device according to the invention with the use of electrical addressing of the cell in proximity shall render it possible to implement a volumetric data storage device with very large capacity both with regard to storage density and transfer rates. The device used in the digital camera according to the present invention has a close analogy in principally correspondingly implemented optical data storage devices based on proximity addressing and realized in volumetric embodiment. Such optical data storage devices are moreover disclosed and discussed in international patent application PCT/NO97/00154 which is included by reference, such that no further details shall be discussed in connection with the embodiment in FIG. 11 and the use of the device and the method according to the invention in volumetrically implemented data storage or data processing devices, but reference only made to what has been disclosed in the above-mentioned patent application.

Another memory suitable for use as non-volatile memory in the digital camera according to the present invention is disclosed in U.S. Pat. No. 6,055,180 to Gudesen et al., entitled, "Electrically Addressable Passive Device, Method for Electrical Addressing of the Same and Uses of the Device and the Method," issued Apr. 25, 2000. The entire disclosure of U.S. Pat. No. 6,055,180 to Gudesen et al. is incorporated herein by reference. Another memory suitable for use as a non-volatile memory in the digital camera according to the present invention is disclosed in PCT International Application No. WO 99/08325 to Inganäs et al., entitled "Electrode Means, Comprising Polymer Materials, With or Without Functional Elements and an Electrode Device Formed of Said Means," having an international filing date of Jul. 13, 1998. The entire disclosure of PCT International Publication No. WO 99/08325 is incorporated herein by reference. Another memory suitable for use in the digital camera according to the present invention is disclosed in PCT International Publication No. WO 00/38234 to Gudesen et al., entitled "Scalable Data Processing Apparatus," having an international filing date of Dec. 3, 1999. The entire disclosure of PCT International Publication No. WO 00/38234 is incorporated herein by reference.

Figure 12:
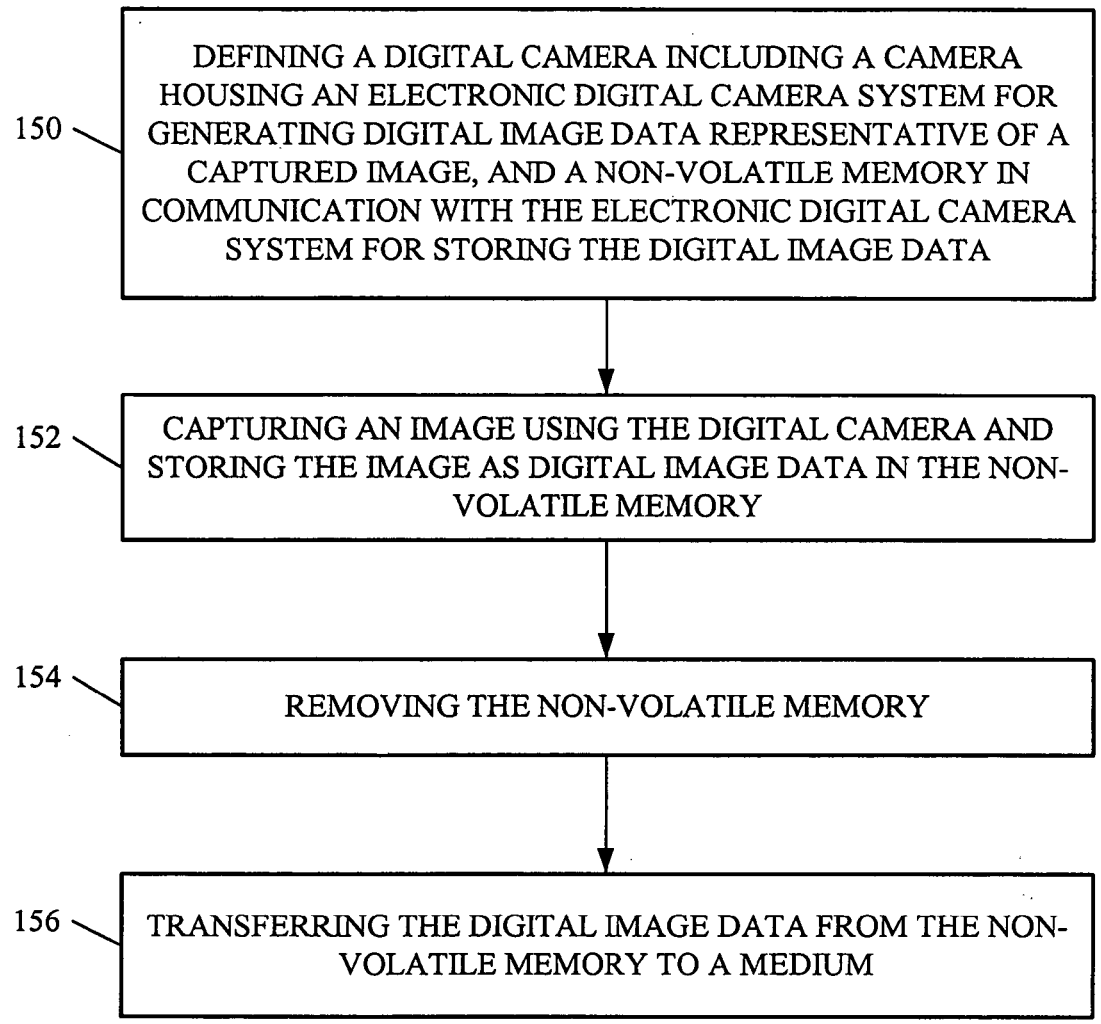
FIG. 12 is a flow diagram illustrating one exemplary embodiment of a method of using a digital camera according to the present invention.

FIG. 12 is a flow diagram illustrating one exemplary embodiment of a method of using the one-time-use digital camera according to the present invention. In step 150, a digital camera is defined as including a camera housing, an electronic digital camera system for generating digital image data representative of a captured image, and a non-volatile memory in communication with the electronic digital camera system for storing the digital image data. In one aspect, the camera housing includes a first portion and a second portion, wherein the non-volatile memory is attached to the second portion of the housing and in communication with the electronic digital camera system for storing the digital image data. In one aspect, the second portion is the back of the housing.

In step 152, an image is captured using the digital camera and the image is stored as digital image data in the non-volatile memory. In one aspect, the digital image data includes one or more still images. In another aspect, the digital image data includes one or more still images with sound associated with the still images. In another aspect, the digital image data includes motion images. In another aspect, the digital image data includes motion images with sound associated with those motion images.

In step 154, the non-volatile memory is removed from the digital camera. In one aspect, wherein the non-volatile memory is attached to a second portion of the housing, the second portion of the housing and the non-volatile memory are removed from the digital camera. In one preferred embodiment, the non-volatile memory is attached to a back portion of the housing.

In step 156, the digital image data is transferred from the non-volatile memory to a portable medium. In one aspect, the portable medium is a digital video disk. In another aspect, the portable medium is a CD-ROM. In another aspect, the portable medium is photographic prints. The non-volatile memory may include an external interface for aiding in transferring the digital image data from the non-volatile memory to an external device for producing the portable medium including the digital image data.

The portable medium (e.g., CD-ROM, DVD, videotape, etc.) containing the digital image data is sent back to the user. In one aspect, the digital camera including the non-volatile memory is brought to a developer or mailed to a central developing location. The digital image data is transferred from the non-volatile memory to a portable medium. The portable medium containing the digital image data is sent back to the user. The non-volatile memory associated with the digital camera is replaced with a second non-volatile memory. As such, the digital camera is available for reuse and resale.

In one preferred embodiment, the method includes the step of defining the non-volatile memory to include a write once memory matrix component including a first layer of parallel conductors, a second layer of parallel conductors oriented mutually orthogonal to the first layer of parallel conductors, and a functional medium disposed between the first layer and the second layer, wherein an addressable cell in the functional medium is defined at an intersection of each first layer parallel conductor and second layer parallel conductor. In one aspect, the functional medium is an organic material having non-linear impedance characteristics. In one aspect, the functional medium includes a polymer material. In one aspect, the functional medium includes an amorphous silicon material. In one aspect, the functional medium includes a low molecular weight organic material. With the unique write once memory matrix component used in the digital camera according to the present invention, the digital image data representative of captured still images and/or motion images are "locked" in memory and cannot be overwritten. Further, the non-volatile memory can be replaced with a second non-volatile memory in the digital camera. As such, the digital camera is refurbished and available for reuse. For example, the digital camera with a second non-volatile memory can be sent back into the retail channel for resale. Further, the one-time-use digital camera according to the present invention provides a relatively inexpensive way for both still and motion images to be captured without requiring the purchase of an expensive digital camera or video camera.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the chemical, mechanical, electromechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A one-time-use camera comprising:
   an electronic digital camera system for generating digital image data representative of a captured image;
   a non-volatile memory in communication with the electronic digital camera system for storing the digital image data, the non-volatile memory comprising a matrix memory component, the matrix memory component including a first layer of parallel conductors, a second layer of parallel conductors oriented mutually orthogonal to the first set of parallel conductors, and a functional medium disposed between the first layer and the second layer, wherein an addressable cell in the functional medium is defined at an intersection of each first layer parallel conductor and second layer parallel conductor; and
   wherein supplying an electrical energy directly to the functional medium of the cell detects or changes the logical state of the cell, for reading and writing the digital image data at the matrix memory component.

2. The camera of claim 1, wherein the functional medium is made of an organic material with non-linear impedance characteristics.

3. The camera of claim 1, wherein the functional medium includes a polymer material.

4. The camera of claim 1, wherein the functional medium includes an amorphous silicon material.

5. The camera of claim 1, wherein the functional medium includes a low molecular weight organic material.

6. The camera of claim 1, further comprising an external interface wherein the external interface is configured for transfer of the digital image data to an external device.

7. The camera of claim 1, wherein the non-volatile memory component is removable from the camera.

8. The camera of claim 7, wherein the non-volatile memory component is replaceable with a second non-volatile memory component for reuse of the camera.

9. The camera of claim 1, wherein the memory component includes an external device interface for transferring the digital image data to an external device.

10. The camera of claim 1, wherein the electronic digital camera system includes a lens system, a shutter system, a charge coupled device, an analog to digital converter, a digital signal processor, and a camera system processor for receiving an image and converting the image to digital image data stored in the memory component.

11. The camera of claim 1, wherein the electronic digital camera system includes an external device interface for transferring the digital image data stored at the memory component to an external device.

12. A one-time-use camera comprising:
    an electronic digital camera system for generating digital image data representative of a captured image;
    a non-volatile memory in communication with the electronic digital camera system for storing the digital image data, the non-volatile memory comprising a matrix memory component, the matrix memory component including a first layer of parallel conductors, a second layer of parallel conductors oriented mutually orthogonal to the first set of parallel conductors, and a functional medium disposed between the first layer and the second layer, wherein an addressable cell in the functional medium is defined at an intersection of each first layer parallel conductor and second layer parallel conductor; and
    wherein supplying an electrical energy directly to the functional medium of the cell detects or changes the logical state of the cell, for reading and writing the digital image data at the matrix memory component, further comprising a camera housing, wherein the wherein the non-volatile memory component is attached to the housing.

13. The camera of claim 12, wherein the housing includes a front portion and a back portion, wherein the non-volatile memory component is attached to the back portion defining a camera back memory assembly.

14. The camera of claim 13, wherein the camera back memory assembly is removable from the front portion.

15. The camera of claim 14, wherein the camera back assembly is replaceable with a second camera back assembly.

16. A one-time-use camera comprising:
    an electronic digital camera system for generating digital image data representative of a captured image, the electronic digital camera system including a mode switch for allowing a user to select a mode of operation of the camera;
    a non-volatile memory in communication with the electronic digital camera system for storing the digital image data, the non-volatile memory comprising a matrix memory component, the matrix memory component including a first layer of parallel conductors, a second layer of parallel conductors oriented mutually orthogonal to the first set of parallel conductors, and a functional medium disposed between the first layer and the second layer, wherein an addressable cell in the functional medium is defined at an intersection of each first layer parallel conductor and second layer parallel conductor; and
    wherein supplying an electrical energy directly to the functional medium of the cell detects or changes the logical state of the cell, for reading and writing the digital image data at the matrix memory component.

17. The camera of claim 16, wherein the electronic digital camera system includes a microphone system for recording sound as part of the digital image data.

18. The camera of claim 16, including a selectable mode of operation for recording a still picture as the digital image data.

19. The camera of claim 16, including a selectable mode of operation for recording still picture and sound associated with the still picture as the digital image data.

20. The camera of claim 16, including a selectable mode of operation for recording video as the digital image data.

21. The camera of claim 16, including a selectable mode of operation for recording video and sound associated with the video as the digital image data.

22. A method of using a one-time-use camera comprising:
defining a digital camera including a camera housing, an electronic digital camera system for generating digital image data representative of a captured image; and a non-volatile memory including a write once memory matrix component in communication with the electronic digital camera system for storing the digital image data;
capturing an image using the digital camera and storing the image as digital image data in the non-volatile memory;
removing the non-volatile memory; and
transferring the digital image data from the non-volatile memory to a portable medium;
defining the write once memory matrix component including a first layer of parallel conductors, a second layer of parallel conductors oriented mutually orthogonal to the first set of parallel conductors, and a functional medium disposed between the first layer and the second layer, wherein an addressable cell in the functional medium is defined at an intersection of each first layer parallel conductor and second layer parallel conductor.

23. The method of claim 22, defining the portable medium as photographic prints.

24. The method of claim 22, defining the portable medium as a digital video disk.

25. The method of claim 22, further comprising replacing the non-volatile memory with a second non-volatile memory such that the one-time-use camera is available for reuse.

26. The method of claim 25, wherein the step of replacing the non-volatile memory with a second non-volatile memory includes replacing the second portion of the housing with a third housing portion having the second non-volatile memory attached thereto.

27. The method of claim 22, further comprising the step of sending the portable medium to a user.

28. The method of claim 22, including defining the functional medium to include an organic material having non-linear impedance characteristics.

29. The method of claim 22, including defining the functional medium to include an amorphous silicon material.

30. The method of claim 22, including defining the functional medium to include a polymer.

31. The method of claim 22, including defining the functional material to include a low molecular weight organic material.

32. A disposable digital camera comprising:
an electronic digital camera system for generating digital image data representative of a captured image, the electronic digital camera system includes a lens system, a shutter system, a charge coupled device, an analog to digital converter, a digital signal processor, and a camera system processor for receiving an image and converting the image to digital image data;
a non-volatile memory in communication with the electronic digital camera system for storing the digital image data, the non-volatile memory comprising a matrix memory component, the matrix memory component including a first layer of parallel conductors, a second layer of parallel conductors oriented mutually orthogonal to the first set of parallel conductors, and a flexible, substantially planar functional medium disposed between the first layer and the second layer, wherein the functional medium is made of an organic material with non-linear impedance characteristics, the functional medium including a polymer material, and wherein an addressable cell in the functional medium is defined at an intersection of each first layer parallel conductor and second layer parallel conductor; and
wherein supplying an electrical energy directly to the functional medium of the cell detects or changes the logical state of the cell, for reading and writing the digital image data at the matrix memory component.

33. The camera of claim 32, further comprising a camera housing, the housing including a front portion and a back portion, wherein the non-volatile memory component is attached to the back portion defining a camera back memory assembly, wherein the camera back memory assembly is removable from the front portion.

34. The camera of claim 33, the back portion having a major surface, the matrix memory component having a substantially planar, layer-like structure attached to the major surface of the back portion.

35. A method, comprising:
attaching a first housing portion having a memory formed therein to a second housing portion to form a one-time-use digital camera;
capturing digital images with the one-time-use digital camera;
removing the first housing portion from the second housing portion; and
retrieving the digital images from the first housing portion.

36. The method of claim 35, comprising:
storing the digital images in the memory; and
retrieving the digital images from the memory in the first housing portion.

37. The method of claim 35, comprising:
disposing of the first housing portion.

38. The method of claim 35, comprising:
reusing the second housing portion;
replacing the first housing portion with a third housing portion having a memory; and
attaching the third housing portion to the second housing portion to form another one-time-use digital camera.

39. The method of claim 35, comprising:
forming the first housing portion and the second housing portion of a polymeric material.

40. The method of claim 35, comprising:
providing the memory as a nonvolatile memory.

41. The method of claim 35, comprising:
providing the memory as a write-once memory.

42. The method of claim 35, comprising:
capturing digital images with the one-time-use digital camera until the memory in the first housing portion is full; and
replacing the first housing portion with a third housing portion having a memory with available storage.

43. The method of claim 35, wherein capturing digital images includes capturing still images.

44. The method of claim 35, wherein capturing digital images includes capturing motion images.

45. The method of claim 35, wherein capturing digital images includes capturing sound associated with the digital images.

46. The method of claim 35, further comprising providing the first housing portion as a camera back assembly.

* * * * *

UNITED STATES PATENT AND TRADEMARK OFFICE
CERTIFICATE OF CORRECTION

| | | |
|---|---|---|
| PATENT NO. | : 6,950,129 B1 | Page 1 of 1 |
| APPLICATION NO. | : 09/718322 | |
| DATED | : September 27, 2005 | |
| INVENTOR(S) | : Mark W. Minne et al. | |

It is certified that error appears in the above-identified patent and that said Letters Patent is hereby corrected as shown below:

IN THE SPECIFICATION

Column 7, line 66, delete "$100_K$" and insert therefor --$110_K$--

IN THE CLAIMS

Column 12, Claim 12, line 25, delete "wherein the"

Signed and Sealed this

Twenty-sixth Day of June, 2007

JON W. DUDAS
*Director of the United States Patent and Trademark Office*